United States Patent
Kato et al.

(10) Patent No.: US 11,522,114 B2
(45) Date of Patent: Dec. 6, 2022

(54) THERMOELECTRIC CONVERSION MATERIAL AND METHOD FOR PRODUCING SAME

(71) Applicant: LINTEC CORPORATION, Itabashi-ku (JP)

(72) Inventors: Kunihisa Kato, Warabi (JP); Wataru Morita, Saitama (JP); Tsuyoshi Mutou, Saitama (JP); Yuma Katsuta, Gyoda (JP); Takeshi Kondo, Saitama (JP)

(73) Assignee: LINTEC CORPORATION, Itabashi-ku (JP)

( * ) Notice: Subject to any disclaimer, the term of this patent is extended or adjusted under 35 U.S.C. 154(b) by 0 days.

(21) Appl. No.: 16/467,745

(22) PCT Filed: Dec. 7, 2017

(86) PCT No.: PCT/JP2017/043938
§ 371 (c)(1),
(2) Date: Jun. 7, 2019

(87) PCT Pub. No.: WO2018/110403
PCT Pub. Date: Jun. 21, 2018

(65) Prior Publication Data
US 2020/0066960 A1    Feb. 27, 2020

(30) Foreign Application Priority Data
Dec. 13, 2016  (JP) .............................. JP2016-241361

(51) Int. Cl.
| | | |
|---|---|---|
| H01L 35/34 | (2006.01) | |
| B32B 7/02 | (2019.01) | |
| B32B 27/18 | (2006.01) | |
| H01L 35/16 | (2006.01) | |
| H01L 35/24 | (2006.01) | |
| H01L 35/26 | (2006.01) | |

(52) U.S. Cl.
CPC ............... *H01L 35/34* (2013.01); *B32B 7/02* (2013.01); *B32B 27/18* (2013.01); *H01L 35/16* (2013.01); *H01L 35/24* (2013.01); *H01L 35/26* (2013.01)

(58) Field of Classification Search
None
See application file for complete search history.

(56) References Cited

U.S. PATENT DOCUMENTS

| | | | | |
|---|---|---|---|---|
| 2005/0126184 A1* | 6/2005 | Cauchy | ................... | H01L 35/32 62/3.3 |
| 2010/0095995 A1 | 4/2010 | Toyoda et al. | | |
| 2012/0018682 A1* | 1/2012 | Minami | ................ | B22F 1/0044 252/514 |
| 2012/0111385 A1* | 5/2012 | Ramanath | ............... | H01L 35/16 136/200 |
| 2014/0338715 A1* | 11/2014 | Grunlan | .................. | H01L 35/24 136/205 |
| 2015/0004733 A1* | 1/2015 | Wang | ....................... | H01L 35/34 438/54 |
| 2015/0048283 A1 | 2/2015 | Kato et al. | | |
| 2015/0228879 A1* | 8/2015 | Kato | ....................... | H01L 35/34 438/54 |
| 2018/0083177 A1* | 3/2018 | Nishizawa | ............... | H01L 35/32 |

FOREIGN PATENT DOCUMENTS

| | | |
|---|---|---|
| CN | 101346449 A | 1/2009 |
| CN | 103413889 A | 11/2013 |
| JP | 2003-46145 A | 2/2003 |
| JP | 2003-229605 | 8/2003 |
| JP | 2008-11 6445 A | 5/2008 |
| JP | 2008-182160 A | 8/2008 |
| JP | 2008-266401 A | 11/2008 |
| JP | 2012-9462 A | 1/2012 |
| JP | 2014-199836 A | 10/2014 |
| JP | 2015-50426 A | 3/2015 |
| JP | 5712340 B1 | 5/2015 |
| WO | WO 2013/141065 A1 | 9/2013 |

(Continued)

OTHER PUBLICATIONS

International Search Report dated Jan. 23, 2018 in PCT/JP2017/043938 filed Dec. 7, 2017.

(Continued)

*Primary Examiner* — Daniel P Malley, Jr.
(74) *Attorney, Agent, or Firm* — Oblon, McClelland, Maier & Neustadt, L.L.P.

(57) ABSTRACT

The present invention provides: a thermoelectric conversion material capable of being produced in a simplified manner and at a lower cost and excellent in thermoelectric performance and flexibility, and a method for producing the material. The thermoelectric conversion material has, on a support, a thin film of a thermoelectric semiconductor composition containing thermoelectric semiconductor fine particles, a heat-resistant resin and an inorganic ionic compound. The method for producing a thermoelectric conversion material having, on a support, a thin film of a thermoelectric semiconductor composition containing thermoelectric semiconductor fine particles, a heat-resistant resin and an inorganic ionic compound includes a step of applying a thermoelectric semiconductor composition containing thermoelectric semiconductor fine particles, a heat-resistant resin and an inorganic ionic compound onto a support and drying it to form a thin film thereon, and a step of annealing the thin film.

7 Claims, No Drawings

(56) References Cited

FOREIGN PATENT DOCUMENTS

WO  WO 2015/019871 A1  2/2015
WO  WO 2016/147809 A1  9/2016

OTHER PUBLICATIONS

Deepa Madan, et al., "Dispenser printed composite thermoelectric thick films for thermoelectric generator applications," Journal of Applied Physics, vol. 109, 034904, 2011, 7 Pages.
Office Action dated Sep. 24, 2021 in the corresponding Korean Patent Application No. 10-2019-7016589, 5 pages.
Office Action dated Oct. 20, 2022 in corresponding Chinese Patent Application No. 201780076510.9, 6 pages.

* cited by examiner

THERMOELECTRIC CONVERSION MATERIAL AND METHOD FOR PRODUCING SAME

TECHNICAL FIELD

The present invention relates to a thermoelectric conversion material that carries out energy interconversion between heat and electricity, and especially relates to a thermoelectric conversion material that uses a thermoelectric semiconductor composition containing a p articulated thermoelectric semiconductor, a heat-resistant resin and an inorganic ionic compound and has improved thermoelectric performance and flexibility, and to its production method.

BACKGROUND ART

Recently, a thermoelectric power-generating technology for which the system is simple and can be down-sized has been specifically noted as a power recovery technology for unharnessed exhaust heat that is generated from fossil fuel resources and others used in buildings, factories, etc. However, thermoelectric power generation is, in general, poorly efficient in power generation, and therefore, studies and developments are being actively made for improving power generation efficiency in various companies and research institutes. For improving power generation efficiency, it is indispensable to enhance the efficiency of thermoelectric conversion materials, and for realizing it, it is desired to develop materials having a high electrical conductivity comparable to that of metals and having a low thermal conductivity comparable to that of glass.

A thermoelectric performance can be evaluated by a figure of merit Z ($Z=\sigma S^2/\lambda$). Here, S means a Seebeck coefficient, a means an electrical conductivity (reciprocal of resistivity), and λ means a thermal conductivity. Increasing the value of the figure of merit Z improves the power generation efficiency, and for enhancing the efficiency in power generation, it is important to find out a thermoelectric conversion material having a large Seebeck coefficient S and a large electrical conductivity a, and having a small thermal conductivity λ.

As described above, investigations for improving power generation efficiency are needed while, on the other hand, thermoelectric conversion devices that are now produced are poor in mass-productivity and the power generation units therein are expensive. Consequently, for further disseminating the devices in use in large areas, for example, in installation thereof on the wall surface of buildings, production cost reduction is imperative. In addition, thermoelectric conversion devices that are produced at present are poorly flexible, and therefore flexible thermoelectric conversion devices are desired.

Given the situation, in Patent Literature 1, a thermoelectric material containing an organic thermoelectric material such as a polythiophene or a derivative thereof and an inorganic thermoelectric material that are integrated in a dispersed state is investigated; and in Patent Literature 2, an organic-inorganic hybrid thermoelectric material containing, as an inorganic thermoelectric material, inorganic particles having an average particle diameter of 1 to 100 nm and being substantially free from a protective agent that may be a factor obstructing carrier transfer, and an organic thermoelectric material is investigated. On the other hand, in Non-Patent Literature 1, an investigation is made on producing a thin-film thermoelectric conversion device for a thermoelectric conversion material by preparing a composition in which bismuth telluride is dispersed in an epoxy resin, and forming the composition into a film by applying. Further, in Patent Literature 3, a thermoelectric conversion material having a thin film formed of a thermoelectric semiconductor composition containing thermoelectric semiconductor fine particles, a heat-resistant resin and an ionic liquid is investigated.

CITATION LIST

Patent Literature

Patent Literature 1: JP 2003-46145 A
Patent Literature 2: JP 2012-9462 A
Patent Literature 3: JP 5712340 B

Non-Patent Literature

Non-Patent Literature 1: D. Madan, Journal of Applied Physics 2011, 109, 034904.

SUMMARY OF INVENTION

Technical Problem

However, the thermoelectric materials of Patent Literatures 1 and 2 could not have sufficient thermoelectric conversion characteristics and in the case where, after the thermoelectric materials are formed into thin films, the resultant films are heat-treated at a high temperature not lower than the decomposition temperature of the organic thermoelectric material therein for the purpose of improving more the thermoelectric conversion characteristics of the films, the organic thermoelectric material disappears to lower the electrical conductivity and the flexibility of the films.

The thin-film thermoelectric conversion device of Non-Patent Literature 1 also has insufficient thermoelectric conversion characteristics, and since heat-treatment is performed at a high temperature not lower than the decomposition temperature of the binder resin therein, the device could have flexibility only on the same level as that of a film formed of bismuth telluride alone.

Further, in Patent Literature 3, an ionic liquid is used as a conductive assistant to improve thermoelectric performance, but the present inventors have further investigated an inorganic ionic compound in place of the ionic liquid, and as a result thereof, have found that the use of the inorganic ionic compound can surprisingly provide a thermoelectric conversion material having more excellent thermoelectric performance and flexibility at a lower cost.

In consideration of the above-mentioned situation, an object of the present invention is to provide a thermoelectric conversion material excellent in thermoelectric performance and flexibility, and can be produced in a simplified manner and at a lower cost, and to provide a method for producing the material.

Solution to Problem

The present inventors have assiduously made repeated studies for solving the above-mentioned problems and, as a result, have found that, when a thin film of a thermoelectric semiconductor composition that contains a particulated thermoelectric semiconductor capable of contributing toward thermal conductivity reduction, a heat-resistant resin and an inorganic ionic compound capable of preventing electrical conductivity reduction in the spaces between the fine particles, is formed on a support, a thermoelectric conversion material having better thermoelectric performance and having excellent flexibility as compared with a thermoelectric conversion material not containing an inorganic ionic compound can be obtained, and have completed the present invention.

Specifically, the present invention provides the following (1) to (11):
(1) A thermoelectric conversion material having, on a support, a thin film of a thermoelectric semiconductor composition containing thermoelectric semiconductor fine particles, a heat-resistant resin and an inorganic ionic compound.
(2) The thermoelectric conversion material according to the above (1), wherein the blending amount of the inorganic ionic compound is from 0.01 to 50% by mass in the thermoelectric semiconductor composition.
(3) The thermoelectric conversion material according to the above (1) or (2), wherein the cation component of the inorganic ionic compound contains at least one selected from a potassium cation, a sodium cation and a lithium cation.
(4) The thermoelectric conversion material according to the above (1) or (2), wherein the anion component of the inorganic ionic compound contains a halide anion.
(5) The thermoelectric conversion material according to the above (4), wherein the halide anion contains at least one selected from Cl$^-$, Br$^-$ and I$^-$.
(6) The thermoelectric conversion material according to any one of the above (1) to (5), wherein the inorganic ionic compound is KBr or KI.
(7) The thermoelectric conversion material according to the above (1), wherein the heat-resistant resin is at least one selected from polyamide resins, polyamideimide resins, polyimide resins and epoxy resins.
(8) The thermoelectric conversion material according to any one of the above (1) to (7), wherein the thermoelectric semiconductor fine particles are fine particles of a bismuth-tellurium-based thermoelectric semiconductor material.
(9) The thermoelectric conversion material according to any one of the above (1) to (8), wherein the support is a plastic film.
(10) A method for producing a thermoelectric conversion material having, on a support, a thin film of a thermoelectric semiconductor composition containing thermoelectric semiconductor fine particles, a heat-resistant resin and an inorganic ionic compound, which includes a step of applying the thermoelectric semiconductor composition containing thermoelectric semiconductor fine particles, a heat-resistant resin and an inorganic ionic compound onto the support, followed by drying it, to form a thin film thereon, and a step of annealing the thin film.
(11) The method for producing a thermoelectric conversion material according to the above (10), wherein the support is a plastic film.

Advantageous Effects of Invention

According to the present invention, there are provided a thermoelectric conversion material excellent in thermoelectric performance and flexibility and capable of being produced in a simplified manner and at a lower cost, and a method for producing the material.

DESCRIPTION OF EMBODIMENTS

[Thermoelectric Conversion Material]

The thermoelectric conversion material of the present invention has, on a support, a thin film of a thermoelectric semiconductor composition containing thermoelectric semiconductor fine particles, a heat-resistant resin and an inorganic ionic compound.
(Support)

Not specifically defined, the support for use in the thermoelectric conversion material of the present invention may be any one not having any influence on lowering the electrical conductivity of the thermoelectric conversion material and on increasing the thermal conductivity thereof. The support includes, for example, glass, silicon, plastic films, etc. Above all, preferred are plastic films from the viewpoint that they are excellent in flexibility.

Concretely, the plastic films include polyethylene terephthalate films, polyethylene naphthalate films, polyimide films, polyamide films, polyether imide films, polyaramid films, polyamideimide films, polyether ketone films, polyether ether ketone films, polyphenylene sulfide films, poly(4-methylpentene-1) films, etc. Laminates of these films are also employable here.

Of those, from the viewpoint that, even when the thin film of a thermoelectric semiconductor composition is annealed, the support is not thermally deformed and can keep the performance of the thermoelectric conversion material, and the support has high heat resistance and dimensional stability, preferred are polyimide films, polyamide films, polyether imide films, polyaramid films and polyamideimide films, and especially preferred are polyimide films from the viewpoint of general versatility thereof.

The thickness of the support is, from the viewpoint of the flexibility, the heat resistance and the dimensional stability thereof, preferably from 1 to 1000 μm, more preferably from 10 to 500 μm, even more preferably from 20 to 100 μm.

Also preferably, the decomposition temperature of the plastic film is 300° C. or higher.
(Thermoelectric Semiconductor Fine Particles)

The thermoelectric semiconductor fine particles for use in the thermoelectric conversion material of the present invention may be prepared by grinding a thermoelectric semiconductor material into a predetermined size, using a fine grinding mill or the like.

The thermoelectric semiconductor material is not specifically limited, as long as it is a material capable of generating a thermoelectromotive force when given a temperature difference applied thereto, and examples thereof include a bismuth-tellurium-based thermoelectric semiconductor material such as a p-type bismuth telluride, an n-type bismuth telluride, and $Bi_2Te_3$; a telluride-based thermoelectric semiconductor material such as GeTe, and PbTe; an antimony-tellurium-based thermoelectric semiconductor material; a zinc-antimony-based thermoelectric semiconductor material such as ZnSb, $Zn_3Sb_2$, and $Zn_4Sb_3$; a silicon-germanium-based thermoelectric semiconductor material such as SiGe; a bismuth-selenide-based thermoelectric semiconductor material such as $Bi_2Se_3$, a silicide-based thermoelectric semiconductor material such as β-$FeSi_2$, $CrSi_2$, $MnSi_{1.73}$, and $Mg_2Si$; an oxide-based thermoelectric semiconductor material; a Heusler material such as FeVAl, FeVAlSi, and FeVTiAl; and a sulfide-based thermoelectric semiconductor material such as $TiS_2$.

Of those, for the thermoelectric semiconductor material for use in the present invention, preferred is a bismuth-tellurium-based thermoelectric semiconductor material such as a p-type bismuth telluride, an n-type bismuth telluride, or $Bi_2Te_3$.

The carrier of the p-type bismuth telluride is a hole and the Seebeck coefficient thereof is positive, for which, for example, preferably used is one represented by $Bi_XTe_3Sb_{2-X}$. In this case X preferably satisfies $0<X\leq0.8$, more preferably $0.4\leq X\leq0.6$. X of more than 0 and 0.8 or less is preferred since the Seebeck coefficient and the electrical conductivity of the material are large and the material can maintain the characteristics of p-type thermoelectric conversion material.

The carrier of the n-type bismuth telluride is an electron and the Seebeck coefficient thereof is negative, for which, for example, preferably used is one represented by $Bi_2Te_{3-Y}Se_Y$. In this case Y is preferably $0\leq Y\leq3$ (when Y=0, $Bi_2Te_3$), more preferably $0.1<Y\leq2.7$. Y of 0 or more and 3 or less is preferred since the Seebeck coefficient and the electrical conductivity of the material are large and the material can maintain the characteristics of n-type thermoelectric conversion material.

The blending amount of the thermoelectric semiconductor fine particles in the thermoelectric semiconductor composition for use in the present invention is preferably 30 to 99% by mass. The amount is more preferably 50 to 96% by mass, even more preferably 70 to 95% by mass. The blending amount of the thermoelectric semiconductor fine particles falling within the above range is preferred since the absolute value of the Seebeck coefficient is large, the electrical conductivity reduction can be prevented, only the thermal conductivity is lowered, and therefore the material exhibits high-level thermoelectric performance and can form a film having a sufficient film strength and flexibility.

The average particle size of the thermoelectric semiconductor fine particles for use in the present invention is preferably 10 nm to 200 μm, more preferably 200 nm to 30 μm, even more preferably 500 nm to 10 μm, and especially preferably 1 to 6 μm. Falling within the range, uniform dispersion is easy and electrical conductivity can be increased.

The method of producing the thermoelectric semiconductor fine particles by finely grinding the thermoelectric semiconductor material is not specifically defined, and the material may be ground into a predetermined size, using a known fine grinding mill or the like, such as a jet mill, a ball mill, a bead mill, a colloid mill, a conical mill, a disc mill, an edge mill, a powdering mill, a hammer mill, a pellet mill, a whirly mill, or a roller mill.

The average particle size of the thermoelectric semiconductor fine particles may be measured with a laser diffraction particle sizer (1064 Model, manufactured by CILAS), and the median value of the particle size distribution is taken as the average particle size.

Preferably, the thermoelectric semiconductor fine particles for use in the present invention are annealed. (Hereinafter the annealing may be referred to as annealing treatment A.) The annealing treatment A increases the crystallinity of the thermoelectric semiconductor fine particles and further increases the Seebeck coefficient of the thermoelectric conversion material since the surface oxide film of the thermoelectric semiconductor fine particles could be removed, therefore further increasing the figure of merit thereof. Not specifically defined, the annealing treatment A is preferably carried out in an inert gas atmosphere such as nitrogen or argon in which the gas flow rate is controlled or in a reducing gas atmosphere such as hydrogen in which also the gas flow rate is controlled, or in a vacuum condition, at a temperature not higher than the melting point of the fine particles, for a few minutes to a few dozen hours, before preparation of the thermoelectric semiconductor composition so that the treatment could not have any negative influence on the thermoelectric semiconductor fine particles therein. Concretely, though depending on the thermoelectric semiconductor fine particles to be used, it is desirable that the treatment is carried out generally at 100 to 1,500° C. for a few minutes to a few dozen hours.

(Inorganic Ionic Compound)

The inorganic ionic compound for use in the present invention is a compound composed of at least a cation and an anion. The inorganic ionic compound exists as a solid in a broad temperature range of 400 to 900° C. and is characterized by having a high ionic conductivity, and therefore, serving as a conductive assistant, the compound can prevent reduction in the electrical conductivity between thermoelectric semiconductor fine particles.

A metal cation is used as the cation.

Examples of the metal cation include an alkali metal cation, an alkaline earth metal cation, a typical metal cation and a transition metal cation, and an alkali metal cation or an alkaline earth metal cation is more preferred.

Examples of the alkali metal cation include $Li^+$, $Na^+$, $K^+$, $Rb^+$, $Cs^+$ and $Fr^+$.

Examples of the alkaline earth metal cation include $Mg^{2+}$, $Ca^{2+}$, $Sr^{2+}$ and $Ba^{2+}$.

Examples of the anion include $F^-$, $Cl^-$, $Br^-$, $I^-$, $OH^-$, $CN^-$, $NO_3^-$, $NO_2^-$, $ClO^-$, $ClO_2^-$, $ClO_3^-$, $ClO_4^-$, $CrO_4^{2-}$, $HSO_4^-$, $SCN^-$, $BF_4^-$, and $PF_6^-$.

As the inorganic ionic compound, known or commercially-available ones can be used. Examples thereof include those composed of a cation component such as a potassium cation, a sodium cation or a lithium cation, and an anion component, e.g., a chloride ion such as $Cl^-$, $AlCl_4^-$, $Al_2Cl_7^-$, or $ClO_4^-$, a bromide ion such as $Br^-$, an iodide ion such as $I^-$, a fluoride ion such as $BF_4^-$ or $PF_6^-$, a halide anion such as $F(HF)_n^-$, or any other anion component such as $NO_3^-$, $OH^-$, or $CN^-$.

Among the above-mentioned inorganic ionic compounds, those having at least one selected from potassium, sodium and lithium as the cation component are preferred from the viewpoint of securing high-temperature stability and compatibility between thermoelectric semiconductor fine particles and resin, and from the viewpoint of preventing reduction in the electrical conductivity between thermoelectric semiconductor fine particles. Also preferably, the anion component of the inorganic ionic compound contains a halide anion, more preferably at least one selected from $Cl^-$, $Br^-$ and $I^-$.

Specific examples of the inorganic ionic compound having a potassium cation as the cation component include KBr, KI, KCl, KF, KOH, and $K_2CO_3$. Among these, KBr and KI are preferred.

Specific examples of the inorganic ionic compound having a sodium cation as the cation component include NaBr, NaI, NaOH, NaF, and $Na_2CO_3$. Among these, NaBr and NaI are preferred.

Specific examples of the inorganic ionic compound having a lithium cation as the cation component include LiF, LiOH, and $LiNO_3$. Among these, LiF and LiOH are preferred.

Preferably, the above inorganic ionic compound has an electrical conductivity of $10^{-7}$ S/cm or more, more preferably $10^{-6}$ S/cm or more. When the electrical conductivity falls within the above range, the inorganic ionic compound serving as a conductive assistant can effectively prevent reduction in the electrical conductivity between the thermoelectric semiconductor fine particles.

Also preferably, the decomposition temperature of the inorganic ionic compound is 400° C. or higher. When the decomposition temperature falls within the above range, the inorganic ionic compound can still maintain the effect thereof as a conductive assistant even when the thin film of the thermoelectric semiconductor composition is annealed, as described below.

Preferably, the mass reduction in the inorganic ionic compound at 400° C. in thermogravimetry (TG) is 10% or less, more preferably 5% or less, even more preferably 1% or less. When the mass reduction falls within the above range, the ionic liquid can still maintain the effect thereof as a conductive assistant even when the thin film of the thermoelectric semiconductor composition is annealed, as described below.

The blending amount of the inorganic ionic compound in the thermoelectric semiconductor composition is preferably from 0.01 to 50% by mass, more preferably from 0.5 to 30% by mass, even more preferably from 1.0 to 10% by mass. When the blending amount of the inorganic ionic compound falls within the above range, the electrical conductivity can be effectively prevented from lowering and, as a result, a film having a high thermoelectric performance level can be realized.

(Heat-Resistant Resin)

The heat-resistant resin for use in the present invention acts as a binder between the thermoelectric semiconductor fine particles and enhances the flexibility of the thermoelectric conversion material. The heat-resistant resin is not specifically defined. The heat-resistant resin for use herein is one that can maintain various physical properties thereof such as mechanical strength and thermal conductivity thereof as a resin without losing them in crystal growth of the thermoelectric semiconductor fine particles through annealing treatment of the thin film of the thermoelectric semiconductor composition.

Examples of the heat-resistant resin includes polyamide resins, polyamideimide resins, polyimide resins, polyether imide resins, polybenzoxazole resins, polybenzimidazole resins, epoxy resins, and copolymers having a chemical structure of these resins. One alone or two or more of the above-mentioned heat-resistant resins may be used here either singly or as combined. Of those, preferred are polyamide resins, polyamideimide resins, polyimide resins and epoxy resins, from the viewpoint that their heat resistance is higher and that they do not have any negative influence on the crystal growth of the thermoelectric semiconductor fine particles in the thin film More preferred are polyamide resins, polyamideimide resins and polyimide resins from the viewpoint that they are excellent in flexibility. In case where a polyimide film is used as the support, polyimide resins are more preferred as the heat-resistant resin, from the viewpoint of the adhesiveness thereof to the polyimide film. In the present invention, polyimide resin is a generic term for polyimide and its precursor.

Preferably, the decomposition temperature of the heat-resistant resin is 300° C. or higher. When the decomposition temperature falls within the above range, the resin does not lose the function thereof as a binder and can maintain the flexibility of the thermoelectric conversion material even when the thin film of the thermoelectric semiconductor composition is annealed, as described below.

Preferably, the mass reduction in the heat-resistant resin at 300° C. in thermogravimetry (TG) is 10% or less, more preferably 5% or less, even more preferably 1% or less. When the mass reduction falls within the above range, the resin does not lose the function thereof as a binder and can maintain the flexibility of the thermoelectric conversion material even when the thin film of the thermoelectric semiconductor composition is annealed, as described below.

The blending amount of the heat-resistant resin in the thermoelectric semiconductor composition is preferably 0.1 to 40% by mass, more preferably 0.5 to 20% by mass, even more preferably 1 to 20% by mass. The blending amount of the heat-resistant resin falling within the above range provides a film satisfying both good thermoelectric performance and film strength.

If desired, the thermoelectric semiconductor composition for use in the present invention may further contain, in addition to the above-mentioned thermal semiconductor fine particles, the above-mentioned heat-resistant resin and the above-mentioned inorganic ionic compound, any other additives such as dispersant, film formation assistant, light stabilizer, antioxidant, tackifier, plasticizer, colorant, resin stabilizer, filler, pigment, conductive filler, conductive polymer, and curing agent. One alone or two or more of these additives may be used here either singly or as combined.

The method for preparing the thermoelectric semiconductor composition for use in the present invention is not specifically defined. The thermoelectric semiconductor composition may be prepared by mixing and dispersing the above-mentioned thermoelectric semiconductor fine particles, the above-mentioned inorganic ionic compound and the above-mentioned heat-resistant resin, optionally along with any other additives and also with a solvent added thereto, according to a known method using an ultrasonic homogenizer, a spiral mixer, a planetary mixer, a disperser, or a hybrid mixer.

Examples of the solvent include toluene, ethyl acetate, methyl ethyl ketone, alcohols, tetrahydrofuran, methylpyrrolidone, and ethyl cellosolve. One alone or two or more different types of these solvents may be used here either singly or as combined. The solid concentration of the thermoelectric semiconductor composition is not specifically defined so far as the composition may have a viscosity suitable for coating operation.

A thin film of the thermoelectric semiconductor composition may be formed by applying the thermoelectric semiconductor composition onto a support and drying it thereon, as described for the production method for the thermoelectric conversion material of the present invention to be given hereinunder. According to the formation method, a large-area thermoelectric conversion material can be produced in a simplified manner at a low cost.

The thickness of the thin film of the thermoelectric semiconductor composition is not specifically defined, but is, from the viewpoint of the thermoelectric performance and the film strength, preferably 100 nm to 200 μm, more preferably 300 nm to 150 μm, even more preferably 5 to 150 μm.

The thermoelectric conversion material of the present invention may be used singly, but for example, plural pieces of the thermoelectric conversion material may be used by being electrically connected in series to each other via an electrode and thermally connected in parallel to each other via a ceramic material or an insulating flexible sheet, and can be used as a thermoelectric conversion device for power generation or for cooling.

[Method for Producing Thermoelectric Conversion Material]

A method for producing the thermoelectric conversion material of the present invention includes a step of applying the above-mentioned thermoelectric semiconductor composition onto a support and drying it to form a thin film thereon (hereinafter this may be referred to as a thin film-forming step), and a step of annealing the thin film (hereinafter this may be referred to as an annealing step). The steps that the present invention includes are described in series hereinunder.

(Thin Film-Forming Step)

The method of applying the thermoelectric semiconductor composition of the present invention onto a support is not specifically defined, for which employable is any known method of screen printing, flexographic printing, gravure printing, spin coating, clip coating, die coating, spray coating, bar coating, or doctor blade coating. In the case where the coating film is pattern-like formed, preferably employed is screen printing or slot die coating that realizes patterning in a simplified manner using a screen having a desired pattern.

Next, the resultant coating film is dried to give a thin film. As the drying method, employable is any known drying method of hot air drying, hot roll drying, or IR radiation. The heating temperature is generally from 80 to 150° C., and the heating time is generally from a few seconds to several tens minutes though it varies depending on the heating method.

In the case where a solvent is used in preparing the thermoelectric semiconductor composition, the heating temperature is not specifically defined so far as it falls within a temperature range capable of removing the used solvent through vaporization.

(Annealing Step)

The resultant thermoelectric conversion material is, after thin film formation, preferably further annealed (hereinafter this treatment may be referred to as annealing treatment B). The annealing treatment B stabilizes the thermoelectric performance of the material and promotes the crystal growth of the thermoelectric semiconductor fine particles in the thin film, therefore further enhancing the thermoelectric performance of the material. Not specifically defined, the annealing treatment B is preferably carried out in an inert gas atmosphere such as nitrogen or argon or in a reducing gas atmosphere, in which the gas flow rate is controlled, or in a vacuum condition. Depending on the upper temperature limit of the resin and the inorganic ionic compound to be used, the treatment may be carried out at 100 to 500° C. for a few minutes to several tens hours.

According to the production method of the present invention, there is provided a low-cost thermoelectric conversion material excellent in thermoelectric performance and flexibility, in a simplified manner.

EXAMPLES

Next, the present invention is described in more detail by reference to the Examples, but it should be construed that the present invention is not limited to these Examples at all.

The thermoelectric performance and the flexibility of the thermoelectric conversion materials produced in Examples and Comparative Examples were evaluated according to the methods mentioned below, in which the electrical conductivity, the Seebeck coefficient and the thermal conductivity of each material were calculated.

<Thermoelectric Performance Evaluation>

(a) Electrical Conductivity

Using a surface resistivity meter (trade name: Loresta GP MCP-T600, manufactured by Mitsubishi Chemical Corporation) and according to a four-terminal method, the surface resistivity of each sample of the thermoelectric conversion materials produced in Examples and Comparative Examples was measured, and the electrical conductivity ($\sigma$) thereof was calculated.

(b) Hall Mobility

Using a Hall effect device (product name: HL550, manufactured by Nanometrics Incorporated), the Hall mobility of the resultant thin film was measured.

Here, the Hall mobility $\mu_H$ is represented by $\mu_H = \sigma \cdot R_H$ where $\sigma$ represents an electrical conductivity and $R_H$ represents a Hall constant. The Hall constant $R_H$ is an amount that directly relates to the carrier density of a thermoelectric conversion material. Measuring the thickness d of a thermoelectric conversion material, the electric current I running through the material, the applied magnetic flux density B and the generated Hall electromotive force $V_H$, the Hall constant $R_H$ ($R_H = dV_H/IB$) is calculated.

(c) Seebeck Coefficient

According to JIS C 2527:1994, the thermoelectromotive force of the thermoelectric conversion material produced in each of Examples and Comparative Examples was measured, and the Seebeck coefficient (S) was calculated. One end of the thermal conversion material produced was heated, and the resulting temperature difference between both ends of the thermal conversion material was measured using a chromel-alumel thermocouple, and from the electrode adjacent to the thermocouple installation position, the thermoelectromotive force was measured.

Concretely, the distance between both ends of the sample of which the temperature difference and the electromotive force were to be measured was to be 25 mm, one end was kept at 20° C., and the other end was heated from 25° C. to 50° C. at intervals of 1° C. whereupon the thermoelectromotive force was measured and the Seebeck coefficient (S) was calculated from the inclination. The installation positions of the thermocouples and the electrodes are symmetric to each other relative to the centerline of the thin film, and the distance between the thermocouple and the electrode is 1 mm.

(d) Power Factor

A power factor PF ($\mu W/cm \cdot K^2$) (a larger value thereof results in higher thermoelectric performance) that indicates a characteristic of a thermoelectric conversion material was calculated from the electrical conductivity $\sigma$ (S/cm) and the Seebeck coefficient S ($\mu V/K$) according to the following equation (1).

$$PF = \sigma S^2 / 1000000 \qquad (1)$$

<Flexibility Evaluation>

The thermoelectric conversion materials produced in Examples and Comparative Examples were evaluated in point of the flexibility of thin films thereof, according to a cylindrical mandrel method where the mandrel diameter $\phi$ is 20 mm. Before and after the cylindrical mandrel test, the outward appearance and the thermoelectric performance of the thermoelectric conversion materials were evaluated, and the flexibility thereof was evaluated according to the following criteria.

A: Before and after the test, no abnormality in the appearance of the thermoelectric conversion material was observed and the electrical conductivity thereof did not change.

B: Before and after the test, no abnormality in the appearance of the thermoelectric conversion material was observed and the electrical conductivity reduction thereof was less than 30%.

C: After the test, the thermoelectric conversion material had the occurrence of cracks and the like, or the electrical conductivity reduction thereof was 30% or more.

(Production Method for Thermoelectric Semiconductor Fine Particles)

Using a planetary ball mill (Premium Line P-7, manufactured by Fritsch Japan Co., Ltd.) a p-type bismuth telluride $Bi_{0.4}Te_3Sb_{1.6}$ (manufactured by Kojundo Chemical Laboratory Co., Ltd., particle size: 180 μm) of a bismuth-tellurium-based thermoelectric semiconductor material was ground in a nitrogen gas atmosphere to give thermoelectric semiconductor fine particles T1 having an average particle size of 1.2 μm. The resultant ground thermoelectric semiconductor fine particles were analyzed for particle size distribution, using a laser diffraction particle size analyzer (Master Sizer 3000, manufactured by Malvern Panalytical Ltd.).

In the same manner as above, an n-type bismuth-telluride $Bi_2Te_3$ (by Kojundo Chemical Laboratory, particle size: 180 μm) being a bismuth-tellurium-based thermoelectric semiconductor material was ground to give thermoelectric semiconductor fine particles T2 having an average particle size of 1.4 μm.

Example 1

Production of Thermoelectric Semiconductor Composition

The resultant fine particles T1 of the bismuth-tellurium-based thermoelectric semiconductor material, a polyamic acid being a polyimide precursor as a heat-resistant resin (poly(pyromellitic dianhydride-co-4,4'-oxydianiline)amide acid solution manufactured by Sigma-Aldrich Corporation, solvent: N-methylpyrrolidone, solid concentration: 15% by mass), and as an inorganic ionic compound, KBr (manufactured by Wako Pure Chemical Industry Co., Ltd.) were mixed such that the respective blending amounts were as shown in Table 1, and dispersed to prepare a coating liquid of a thermoelectric semiconductor composition.

Production of Thermoelectric Conversion Material

The coating liquid prepared in the above was applied onto a polyimide film substrate of a support (product name: Kapton 200H, manufactured by Teijin-DuPont Co., Ltd., thickness 50 μm), using an applicator, and then dried in an argon atmosphere at a temperature of 150° C. for 10 minutes to give a thin film having a thickness of 20 μm. Next, the resultant thin film was heated in a mixed gas atmosphere of hydrogen and argon (hydrogen/argon=3% by volume/97% by volume) at a heating rate of 5 K/min and kept at 400° C. for 1 hour for annealing of the film, thereby inducing crystal growth of the fine particles of the thermoelectric semiconductor material to give a thermoelectric conversion material.

Example 2

A thermoelectric conversion material was produced in the same manner as in Example 1 except that the inorganic ionic compound was changed to KI (manufactured by Wako Pure Chemical Industry Co., Ltd.).

Example 3

A thermoelectric conversion material was produced in the same manner as in Example 1 except that the thermoelectric semiconductor fine particles were changed from T1 to T2.

Example 4

A thermoelectric conversion material was produced in the same manner as in Example 2 except that the thermoelectric semiconductor fine particles were changed from T1 to T2.

Comparative Example 1

A thermoelectric conversion material was produced in the same manner as in Example 1 except that the inorganic ionic compound was not added and the blending amounts were as shown in Table 1.

Comparative Example 2

A thermoelectric conversion material was produced in the same manner as in Example 3 except that the inorganic ionic compound was not added and the blending amounts were as shown in Table 1.

TABLE 1

| | | Thermoelectric Semiconductor Fine Particles | | Heat-Resistant Resin | | Inorganic Ionic Compound | |
|---|---|---|---|---|---|---|---|
| | | Average Particle Size (μm) | Blending Amount (mass %) | Kind | Blending Amount (mass %) | Kind | Blending Amount (mass %) |
| Example 1 | T1 | 1.2 | 92 | Polyimide Resin | 4 | KBr | 4 |
| Example 2 | T1 | 1.2 | 92 | Polyimide Resin | 4 | KI | 4 |
| Example 3 | T2 | 1.4 | 92 | Polyimide Resin | 4 | KBr | 4 |
| Example 4 | T2 | 1.4 | 92 | Polyimide Resin | 4 | KI | 4 |
| Comparative Example 1 | T1 | 1.2 | 92 | Polyimide Resin | 8 | — | — |
| Comparative Example 2 | T2 | 1.4 | 92 | Polyimide Resin | 8 | — | — |

With respect to the thermoelectric conversion materials obtained in Examples 1 to 4 and Comparative Examples 1 and 2, the results of thermoelectric performance evaluation (electrical conductivity, Hall mobility, Seebeck coefficient, power factor) and flexibility evaluation are shown in Table 2.

TABLE 2

|  | Annealing Treatment B | Thermoelectric Performance Evaluation | | | | Flexibility |
|---|---|---|---|---|---|---|
|  |  | Electrical Conductivity (S/cm) | Hole Mobility ($cm^2$/V · s) | Seebeck Coefficient (μV/K) | Power Factor (μW/cm · $K^2$) |  |
| Example 1 | yes | 10 | 5 | 220 | 0.4840 | A |
| Example 2 | yes | 5 | 4 | 222 | 0.2464 | A |
| Example 3 | yes | 10 | 1 | −150 | 0.2250 | A |
| Example 4 | yes | 5 | 2 | −160 | 0.1280 | A |
| Comparative Example 1 | yes | 0.1 | 0.1 | 215 | 0.0046 | A |
| Comparative Example 2 | yes | 0.2 | 0.1 | −150 | 0.0045 | A |

It can be seen that the thermoelectric conversion materials of Examples 1 and 2 had an electrical conductivity of approximately 50 to 100 times higher than that of the material of Comparative Example 1 in which no inorganic ionic compound was added and had a Hall mobility of approximately 40 to 50 times higher than the latter, and that before and after the cylindrical mandrel test, these thermoelectric conversion materials did not have the occurrence of cracks and the like, showed little reduction in the electrical conductivity and the Hall conductivity, and had excellent flexibility.

Similarly, it can be seen that the thermoelectric conversion materials of Examples 3 and 4 had an electrical conductivity of approximately 25 to 50 times higher than that of the material of Comparative Example 2 in which no inorganic ionic compound was added and had a Hall mobility of approximately 10 to 20 times higher than the latter, and that before and after the cylindrical mandrel test, these thermoelectric conversion materials did not have the occurrence of cracks and the like, showed little reduction in the electrical conductivity and the Hall conductivity, and had excellent flexibility.

INDUSTRIAL APPLICABILITY

The thermoelectric conversion material of the present invention is formed into a thermoelectric conversion element that carries out energy interconversion between heat and electricity, and is set in a module and put into practical use. Concretely, the present invention provides a thermoelectric conversion material capable of being produced in a simplified manner and at a low cost and excellent in thermoelectric performance and flexibility, which can be used as a low-cost thermoelectric conversion material for large-area applications for, for example, installation on wall surfaces or curved surfaces of buildings, etc.

The invention claimed is:

1. A thermoelectric conversion material having, on a support, a thin film of a thermoelectric semiconductor composition comprising:
   thermoelectric semiconductor fine particles,
   a heat-resistant resin,
   and an inorganic ionic compound, wherein the inorganic ionic compound is KBr,
   wherein
   an average particle size of the thermoelectric semiconductor fine particles is 10 nm to 200 μm,
   the inorganic ionic compound exists as a solid in a temperature range of 400 to 900° C., and
   a bond between the thermoelectric semiconductor fine particles comprises the heat-resistant resin as a binder.

2. The thermoelectric conversion material according to claim 1, wherein the blending amount of the inorganic ionic compound is from 0.01 to 50% by mass in the thermoelectric semiconductor composition.

3. The thermoelectric conversion material according to claim 1, wherein the heat-resistant resin is at least one selected from the group consisting of polyamide resins, polyamideimide resins, polyimide resins and epoxy resins.

4. The thermoelectric conversion material according to claim 1, wherein the thermoelectric semiconductor fine particles are fine particles of a bismuth-tellurium-based thermoelectric semiconductor material.

5. The thermoelectric conversion material according to claim 1, Wherein the support is a plastic film.

6. A method for producing a thermoelectric conversion material having, on a support, a thin film of a thermoelectric semiconductor composition comprising:
   thermoelectric semiconductor fine particles,
   a heat-resistant resin, and
   an inorganic ionic compound, wherein the inorganic ionic compound is KBr,
   wherein
   an average particle size of the thermoelectric semiconductor fine particles is 10 nm to 200 μm,
   the inorganic ionic compound exists as a solid in a broad temperature range of 400 to 900° C., and
   a bond between the thermoelectric semiconductor fine particles comprises the heat-resistant resin as a binder,
   the method comprising applying the thermoelectric semiconductor composition comprising thermoelectric semiconductor fine particles, the heat-resistant resin and the inorganic ionic compound onto the support, followed by drying it, to form a thin film thereon, and then annealing the thin film.

7. The method for producing a thermoelectric conversion material according to claim 6, wherein the support is a plastic film.

* * * * *